United States Patent [19]

Spencer et al.

[11] Patent Number: 5,522,943
[45] Date of Patent: Jun. 4, 1996

[54] PORTABLE POWER SUPPLY

[76] Inventors: Jerald C. Spencer, 212 7th Ave.;
William C. R. Crane, 2074 Oro Fino Gulch, both of Helena, Mont. 59601

[21] Appl. No.: 350,433

[22] Filed: Dec. 5, 1994

[51] Int. Cl.$^6$ .......................... H01L 31/045; H01L 31/048
[52] U.S. Cl. .......................... 136/245; 136/251; 136/291; 320/2
[58] Field of Search ....................... 136/245, 251, 136/291; 320/2

[56] References Cited

U.S. PATENT DOCUMENTS

| 5,039,928 | 8/1991 | Nishi et al. | 320/2 |
| 5,260,885 | 11/1993 | Ma | 364/708.1 |

FOREIGN PATENT DOCUMENTS

| 2666943 | 3/1992 | France | 136/245 |
| 1-64372 | 3/1989 | Japan | 136/245 |
| 5-343725 | 12/1993 | Japan | 136/245 |

*Primary Examiner*—Aaron Weisstuch

[57] ABSTRACT

A portable power supply that includes at least one solar panel assembly that is capable of producing an electrical output through the conversion of solar energy to electrical energy. The power supply further includes power transmission means which is typically an electrical cable that will supply the power output of the solar panel to an electrical energy consuming device such as a portable computer or a battery for use therewith. The portable power supply further includes a case having at least two opposing side panels and includes solar panel assembly attachment means permitting the mounting of a solar panel assembly. The solar panel assembly typically comprises a photovoltaic panel attached to a backing panel. Backing panels utilized in the solar panel assembly may also be foldable, thus protecting the attached photovoltaic panel within the folded sections of the backing panel.

21 Claims, 5 Drawing Sheets

PORTABLE POWER SUPPLY

BACKGROUND

Portable computers and other electronic devices are now commonly used in remote locations or other locations inconvenient for conventional electrical usage. These remote locations may vary widely. For example, the confines of an airplane or airport terminal encountered by a travelling business person typically do not provide electricity for those desiring to utilize electronic devices. Similarly, a remote location such as a wilderness area would present problems to a research scientist, or park ranger desiring to use an electronics device.

The users of these electronic devices are faced with the obvious problem of providing adequate power to the device they are using. Currently the operator of these devices is provided a single solution to the operation of a device in a remote location. This solution is to provide power to the device from rechargeable batteries.

The batteries appropriate for use by electronic devices present several problems to the user. The user may have no access to a convenient source of electricity necessary to recharge the batteries and must, therefore, bring a large number of batteries into a remote location if power may be required for a long period. Batteries utilized by electronics are expensive, thus requiring a substantial investment to a user having the necessity of more than one battery. Additionally, batteries appropriate for use by electronic devices utilize materials that are harmful to the environment and are hazardous once disposed. For this reason many users of these batteries are uncomfortable with their use.

Furthermore, batteries of the type used by electronic devices such as computers are bulky and heavy, causing both discomfort and inconvenience during transport. If the user is travelling by foot, the problems are greatly exaggerated.

For the foregoing reasons there is a need for a power source for portable computers and other electronic devices that will provide a reliable source of power for anyone needing to operate such a device in a remote location or less remote location not providing electrical power. There is also a need for a power source that is small, light weight, and inexpensive. There is additionally a need for a power source that provides reliable power to an electronics device in a clean, efficient manner.

SUMMARY

The present invention is drawn to a portable power source that satisfies the aforementioned need for a power source that will provide a reliable source of power to an electronic device, thus permitting the use of such a device in remote locations. The present invention further satisfies the need for an inexpensive power source that is both small and lightweight. The present invention additionally satisfies the need for a power source that provides power in a clean, efficient manner.

The present invention comprises a portable power supply that includes at least one solar panel assembly that is capable of producing an electrical output through the conversion of solar energy to electrical energy. The power supply further includes power transmission means which is typically an electrical cable that will supply the power output of the solar panel to an electrical energy consuming device such as a portable computer or a battery for use therewith.

The present invention further includes a case having at least two opposing side panels and including solar panel assembly attachment means permitting the mounting of a solar panel assembly. The solar panel assembly attachment means is typically a fastener such as a snap that permits temporary detachment of the solar panel assembly. The solar panel assembly typically comprises a photovoltaic panel attached to a backing panel. The photovoltaic panels are typically manufactured of a silicon material. Backing panels utilized in the solar panel assembly may also be foldable, thus protecting the attached photovoltaic panel within the folded sections of the backing panel.

The case of the present invention includes opposing side panels spaced apart from another to define an interior article holding area. This interior article holding area is typically sufficient in size to retain an electronic device such as a portable computer or battery. The case of the present invention typically includes means to attach the edges of the opposing side panels such as by a zipper or other fastener. The case further includes solar panel assembly attachment means that typically comprises a fastener. The fastener utilized may be of a detachable type such as a snap fastener utilized frequently in fabric assemblies. The case may also include a handle and may come equipped with a battery. The output voltage of the solar panel may be converted to an appropriate voltage by the inclusion of a voltage regulator.

The portable power supply of the present invention provides a number of benefits that heretofore have been unavailable to users of electronic devices. The benefits provided by the present invention are most evident to users interested in using electronic devices in remote areas or other environments or locations where obtaining a reliable power supply is inconvenient.

The first benefit of the portable power supply of the present invention is the ease in which a user of an electronic device, such as a computer, can provide a reliable source of power to the device. The present invention utilizes photovoltaic solar panels requiring only an adequate source of sunlight to provide power to an electronic device.

The portable power source of the present invention utilizes familiar power cords or cables to transmit power from the photovoltaic solar panels to the electronic device. The attachment of the electronic device to the power source is achieved in a manner that is similar to that of existing power supplies that do not utilize the benefits of photovoltaic solar panels. Because of this simplicity of usage the benefits of the present invention are easily achieved by the user.

Further benefits offered by the portable power supply of the present invention include that it is of a small size and is also lightweight. An electronic device user that must travel with the device or take the device into a remote location will appreciate the compact nature of the invention. Furthermore, the invention is very light in weight and eliminates the need to travel with multiple batteries as the portable power source will provide a reliable source of power to the electronic device. The elimination of multiple batteries is also a substantial cost savings to the user and also makes transport of an electronic device easier as the extra weight of extra batteries is eliminated. The elimination of batteries is an attractive benefit to many users as batteries have traditionally been difficult to dispose due to the harmful materials utilized in their construction. The use of sunlight as a source to generate usable power provides easily understood substantial environmental benefits, as well.

Additional benefits of the present invention are derived by the inclusion of a case that provides protective storage for an electronic device such as a portable computer. This storage area is also suitable for the storage of a battery which may also may be equipped with the portable power supply. The case provides an attachment for a solar panel assembly that allows the user to transport the electronics device and a battery all in a single, lightweight unit, together with the power supply necessary for their operation.

Another benefit of the present invention is the ability of the user to recharge a battery at any time an adequate light source is available. The battery to be recharged may be either located internally within an electronic device or external to it for it to receive the benefits of the invention. The user of the portable power supply needs only to place the solar panel assembly of the present invention facing sunlight or in an area receiving sufficient reflected light and attach the power output of the solar panel assembly to a battery to initiate recharging.

The portable power supply of the present invention is inexpensive to manufacture, thus making the many benefits it offers easily available to many users of electronic devices.

These and other advantages and benefits of the present invention will become apparent upon the inspection of the accompanying specification, claim, and drawings.

DRAWINGS

DESCRIPTION

Figure 1:
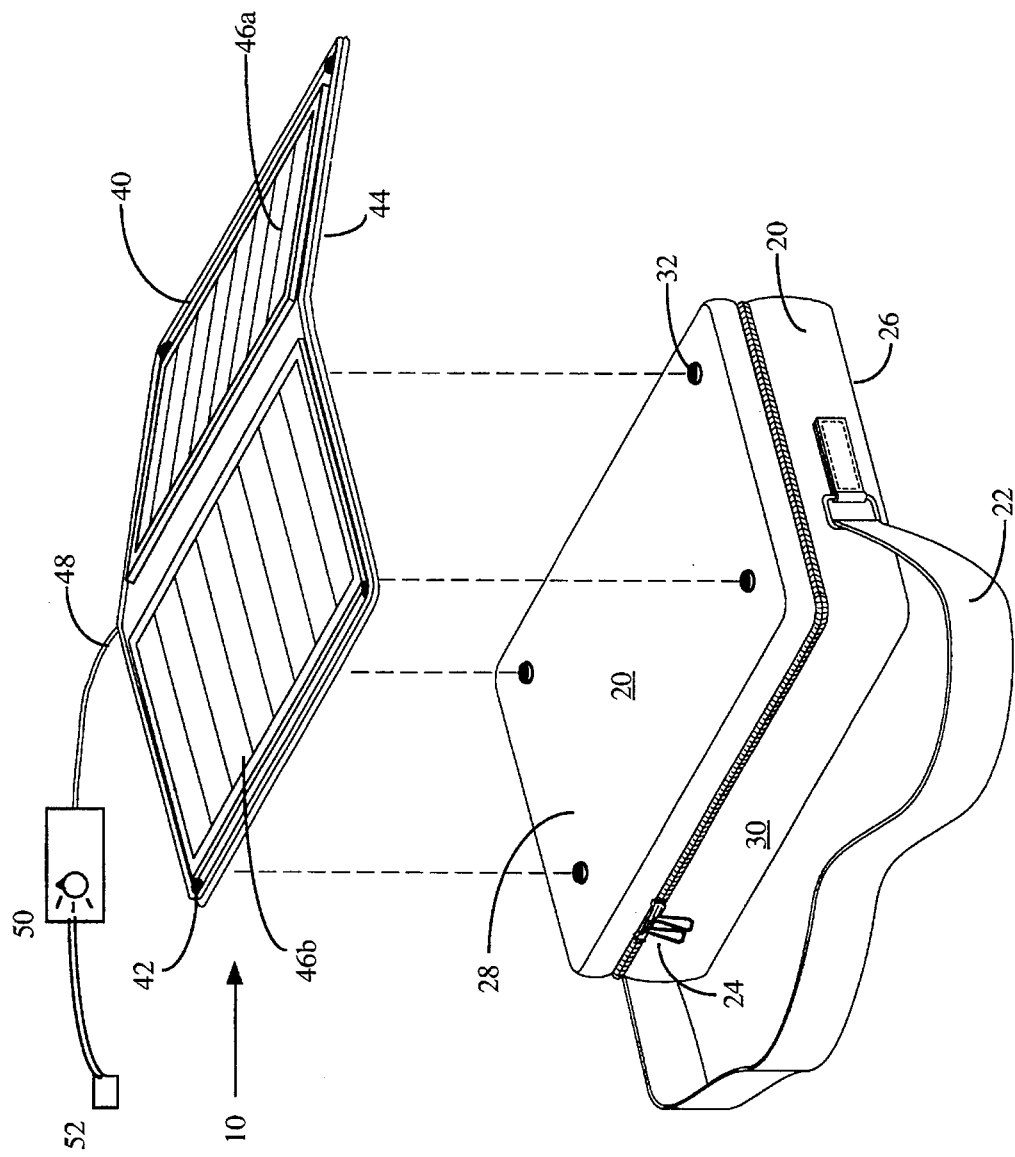
FIG. 1 is a perspective view of a version of the portable power supply or the present invention showing one version of the attachment means utilized to attach the solar panel assembly to the case.
Figure 2:
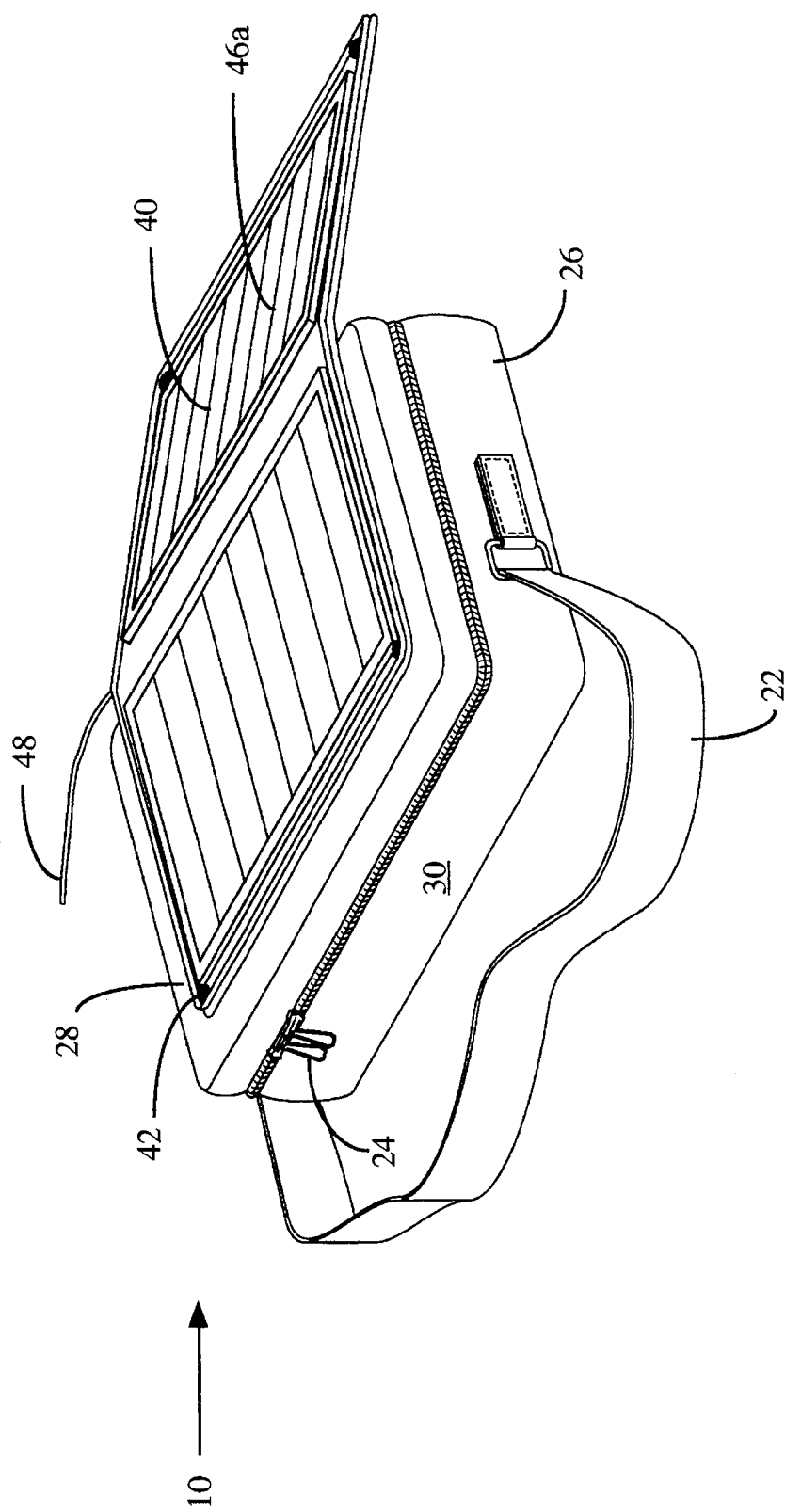
FIG. 2 shows the solar panel assembly of FIG. 1 attached to the case and in an open position.
Figure 3:
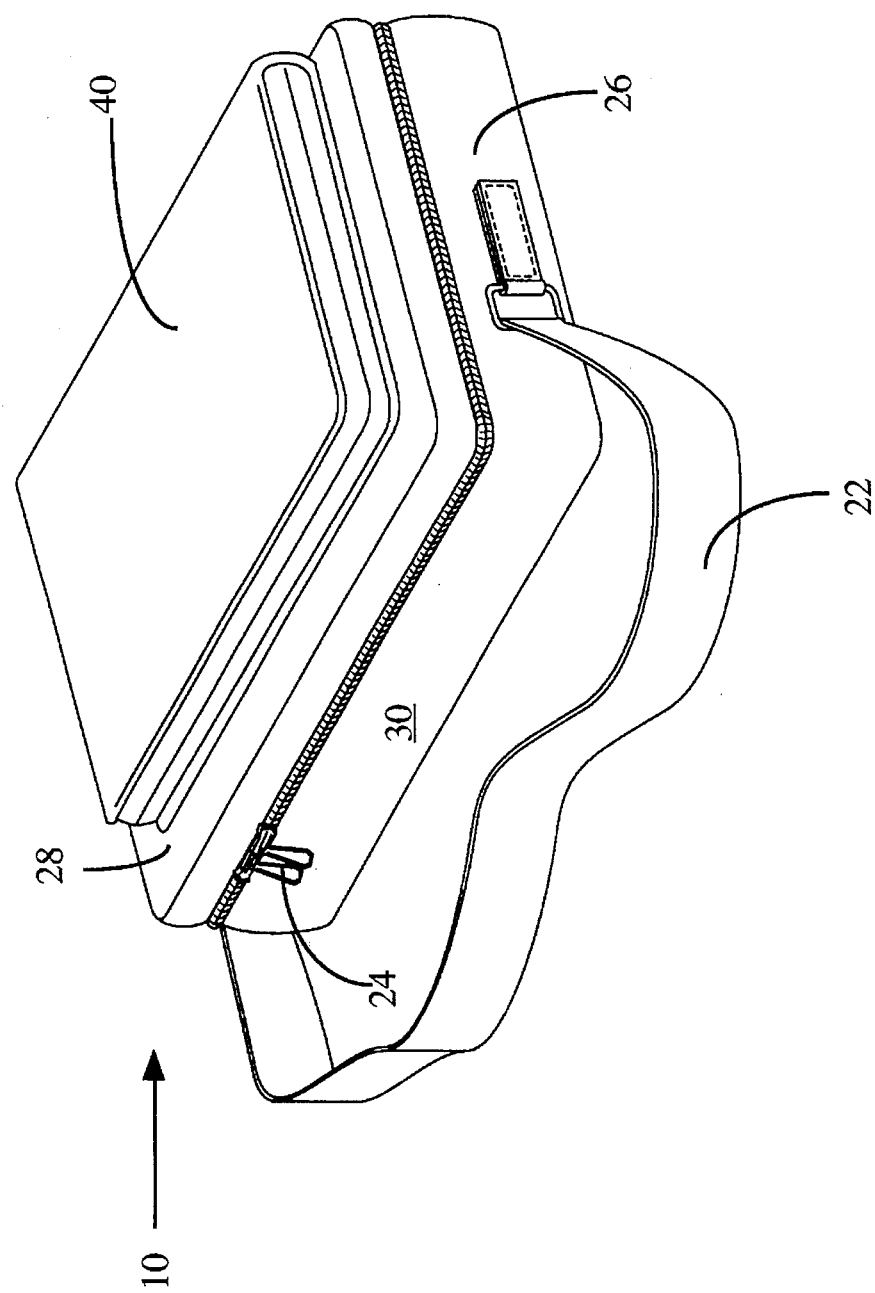
FIG. 3 shows the version of the portable power supply shown in FIG. 1 with the solar panel assembly in a closed position.
Figure 4:
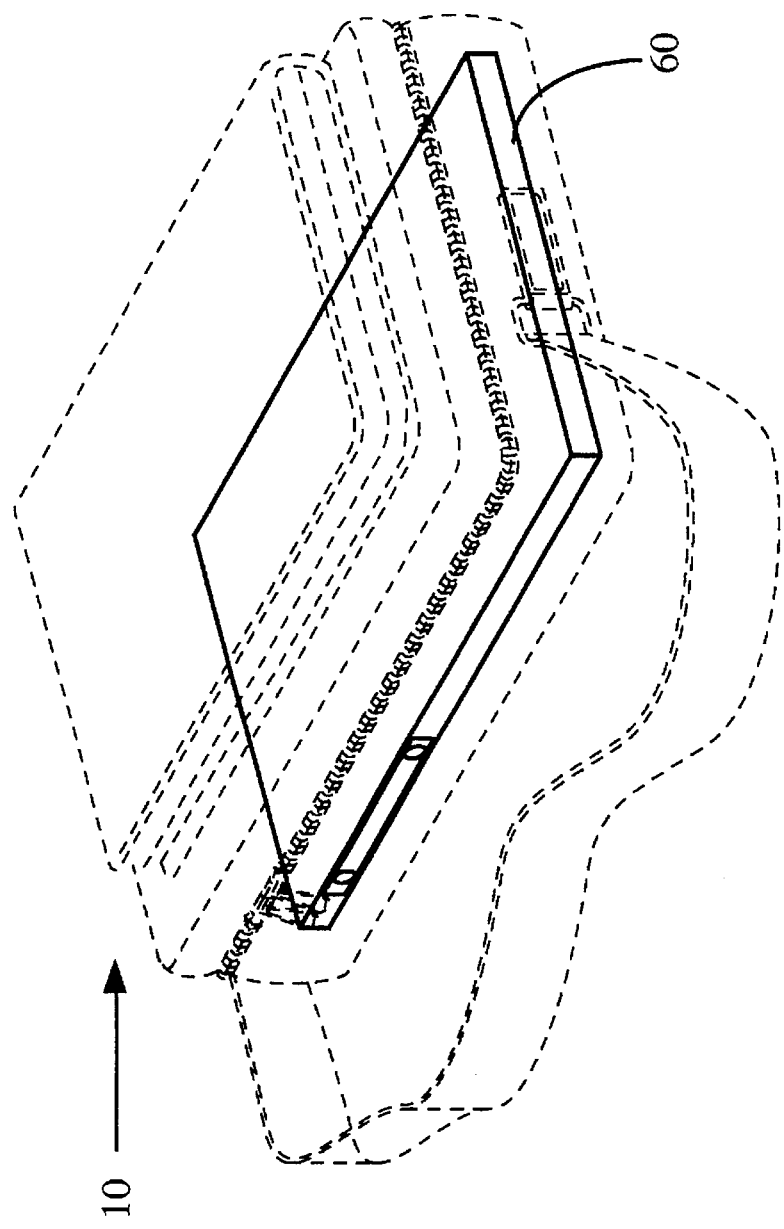
FIG. 4 shows a battery retained within the case of the portable power supply.

As shown in FIGS. 1–3 the portable power supply of the present invention includes a solar panel assembly 40 attached to a case 20. The solar panel assembly 40 comprises a pair of photovoltaic panels 46a and 46b attached to a backing panel 44. The photovoltaic panels 46a and 46b are typically constructed of crystalline silicon semiconductive material. The photovoltaic panels produce an output power that is transmitted by power cable 48. The power transmission means 48 further may include a voltage regulator 50 to convert the output voltage of the solar panel assembly into a desired voltage level. The power transmission cable 48 also typically includes a cable end or jack 52 that permits the attachment of the power cable 48 to an electronic device such as a computer (not shown) or to a battery as shown in FIG. 4.

The solar panel assembly backing panel 44 is typically rigid and may be constructed of various materials such as plastics or metal. The version of the present invention shown in FIGS. 1–4 shows the solar panel assembly 40 having a backing panel 44 that is foldable. This feature allows the solar panel assembly to be folded to thereby enclose the photovoltaic panels within the opposing sections of the packing panel 44. The solar panel assembly of this version of the present invention is shown in an open or unfolded position in FIGS. 1 and 2 and in a closed or folded position in FIG. 3.

The case 20 included in this version of the present invention includes opposing side panels 26 and 28, upstanding wall panels 30 intermediate the opposing side panels 26 and 28. The case 20 further includes a handle 22 and means to attach the opposing side panels, i.e. zipper 24.

The case 20 further includes solar panel attachment means 32. The version of the present invention shown in FIGS. 1–4 shows detachable snaps 32 as the solar panel assembly attachment means. It is understood that a large variety of attachment means could be utilized to perform the function of attaching a solar panel assembly to the case. These embodiments could include hook and loop fasteners, fabric straps, rivets or grommets or other well known fasteners utilized in the manufacture of leather and fabric products.

The snaps 32 of this version of the present invention permit the temporary detaching of the solar panel assembly from the case. The case 20 is of sufficient size to transport a portable computer or other electronic device and may be constructed of materials typically utilize for cases such as the aforementioned leather and fabric materials.

Figure 5:
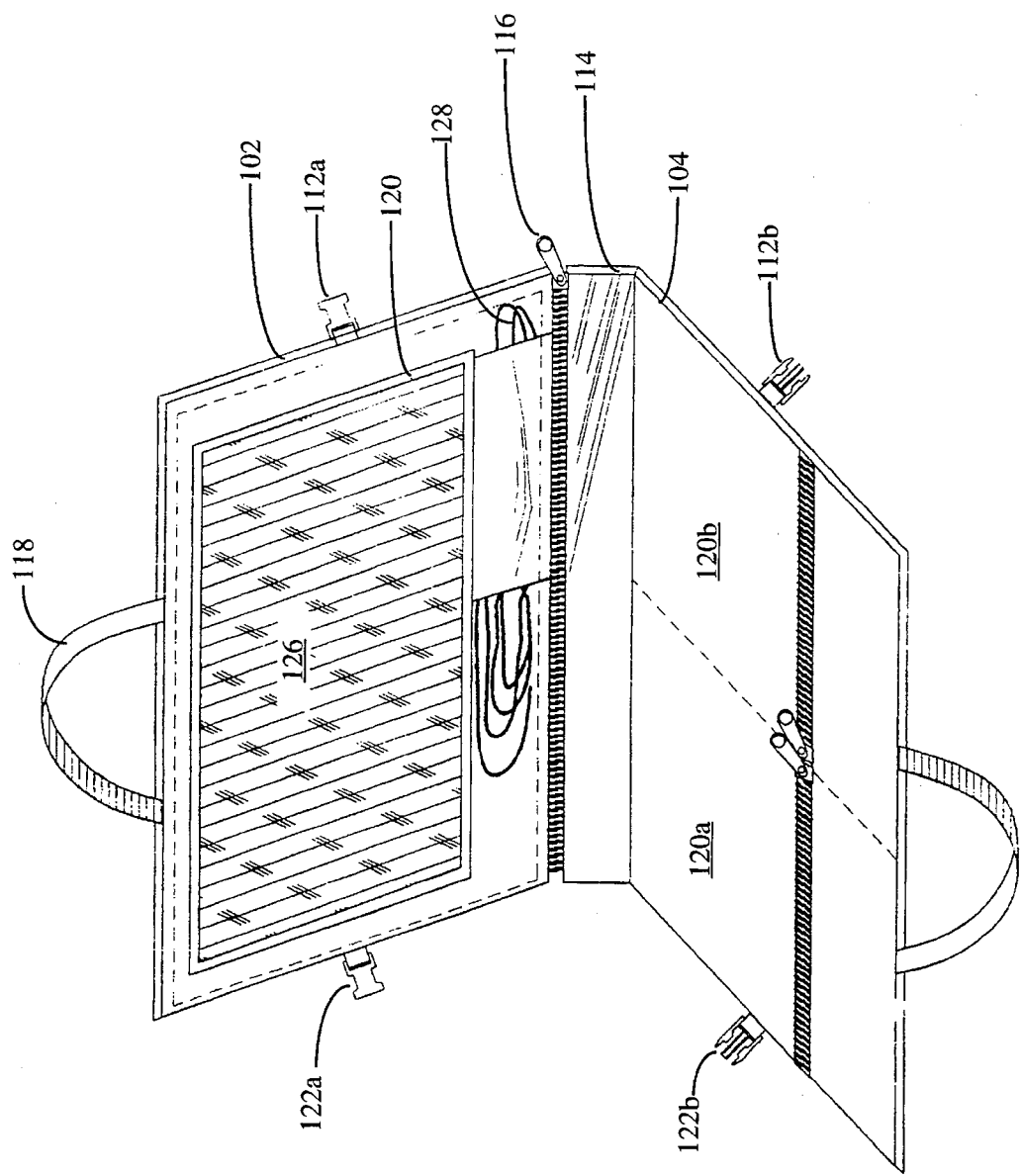
FIG. 5 shows a second version of the portable power supply of the present invention.

A second version or embodiment of the present invention is shown in FIG. 5. In this version of the present invention the portable power supply 100 includes a case having opposing side panels 102 and 104. Separating side panels 102 and 104 is panel 114. The opposing side panels are attached to each other through the use of a zipper 116 and fasteners 112a and 112b as well as 122a and 122b. This version of the present invention includes a solar panel assembly 126 attached to the case by fabric strap 120. The portable power supply 100 further includes power transmission cable 128 and handles 118. This version of the present invention is also reversible and includes pockets 120a and 120b.

The various embodiments of the present invention may also include a rechargeable battery 60 as is shown in FIG. 4. A rechargeable battery of this type is conveniently recharged by the output power of the solar panel assembly.

The portable power supply of the present invention is simple in use. The portable power supply 10 permits the user of an electronic device to carry the device within the case 20. The user may actually recharge the internal battery of an electronic device or an external battery 60 while the battery or electronic device remains Within the case. This is accomplished by facing the opened solar panel assembly 40 towards a suitable source of sunlight and attaching the power cable 48 to the electronic device or battery. The output power generated by the solar panel assembly photovoltaic panels is transmitted through cable 48 which that may include a voltage regulator 50 to convert the output voltage to a desired setting. This voltage regulator 50 may have different settings permitting the use of the system with devices requiring different voltage inputs.

The portable power supply is suitable to run or assist in running a portable computer or other electronic device directly from the output voltage of the solar panel assembly. Once a suitable source of sunlight is achieved the power cable can be attached to the device and use can commence. In this way the portable power supply is as easy to use as plugging the device into a wall socket. As long as the sunlight continues a reliable source of power is available. The solar panel assembly, if detached from the case, as is as shown in FIG. 1, can be placed in a variety oppositions to utilize the sunlight available. Once use of the electronic device is stopped the user simply returns the electronic device to the case and closes the solar panel assembly 40. The portable power supply 10 is of a durable yet inexpensive construction that is appropriate for travel. This travel arrangement is shown in FIG. 3. FIG. 3 further shows the compactness and the convenience offered by the present invention. The case handle 22 further simplifies the transport of the portable power supply.

Alternative designs to the portable power supply that do not stray from the primary scope of the invention include various materials utilized in the construction of the case and in the backing panel of the solar panel assembly. Further alternative designs may incorporate materials other than crystalline silicon semiconductive material in the construction of the photovoltaic panels. Additionally, alternative designs of the attachment means for use in the attachment of the solar panel assembly to the case may be utilized.

It is understood that other various modifications and changes in form or detail could readily be made without departing from the spirit of the invention. It is therefore intended that the invention be not limited to the exact form and detail herein shown and described, nor to anything less than the whole of the invention herein disclosed and hereinafter claimed.

We claim:

1. A portable power supply for detachable use with a variety of electronic devices of the type having an integral external housing encasing the electronic components of the device, the portable power supply comprising:

at least one solar panel assembly capable of producing an electrical power output through the conversion of solar energy to electrical energy, power transmission means for supplying the solar panel electrical output to an electronic device, the power transmission means including means to detachably connect the solar panel assembly to an electronic device thereby transmitting power, whereby, upon detachment of the connection means power transmission is ceased, the power transmission means permitting use of the solar panel assembly with a variety of electronic devices, a case comprising at least two opposing side panels, the spaced opposing side panels defining an intervening article holding area, the article holding area of the case being of sufficient size to accommodate an entire electronic device of the type having an integral external housing encasing the electronic components of the device, the article holding area further being of sufficient size to accommodate a variety of different electronic devices, and providing an area within which an electronic device may be detachably connected to the solar panel assembly by the power transmission means, the case further being completely readily separable from an electronic device held in the article holding area, the side panels including at least one solar panel attachment means for mounting of a solar panel assembly, the solar panel attachment means further being of a detachable type, readily permitting temporary detachment and reattachment of the solar panel assembly to the case.

2. The portable power supply of claim 1, wherein the solar panel assembly attachment means comprises snap connection means permitting the detachable mounting of the solar panel assembly.

3. The portable power supply of claim 1, wherein the solar panel assembly comprises at least one photovoltaic panel attached to a backing panel.

4. The portable power supply of claim 3, wherein the backing panel is sectional and may be folded to protect the attached photovoltaic panel within the folded sections of the backing panel.

5. The portable power supply of claim 1, wherein the article holding area is sufficient size to hold a portable computer.

6. The portable power supply of claim 1, additionally including means to detachably connect the opposing side panels of the case.

7. The portable power supply of claim 6, wherein the means to detachably connect the opposing side panels of the case is a zipper.

8. The portable power supply of claim 1, wherein the solar panel assembly attachment metals are disposed on the exterior surfaces of the case panels.

9. The portable power supply of claim 1, wherein the case additionally includes a handle.

10. The portable power supply of claim 1, wherein the power transmission means includes an electrical storage device.

11. A portable power supply for detachable use with a variety of electronic devices of the type having an integral external housing encasing the electronic components of the device, the portable power supply comprising:

at least one solar panel assembly capable of producing an electrical power output through the conversion of solar energy to electrical energy, power transmission means for supplying the solar panel electrical output to an electronic device, the power transmission means including means to detachably connect the solar panel assembly to an electronic device thereby transmitting power, whereby, upon detachment of the connection means power transmission is ceased, the power transmission means permitting use of the solar panel assembly with a variety of electronic devices, a case comprising at least two opposing side panels, the spaced opposing side panels defining an intervening article holding area, the article holding area of the case being of sufficient size to accommodate an entire electronic device of the type having an integral external housing encasing the electronic components of the device, the article holding area further being of sufficient size to accommodate a variety of different electronic devices, and providing an area within which an electronic device may be detachably connected to the solar panel assembly by the power transmission means, the case further being completely readily separable from an electronic device held in the article holding area, the side panels including at least one solar panel attachment means for selectively detachably mounting of a solar panel assembly thereto, the solar panel assembly additionally including voltage regulation means for converting the output voltage component of the solar panel assembly electrical power output to that required by an electronic device, the voltage regulation means further including different output settings permitting the use of the power supply with devices requiring different voltage inputs.

12. The portable power supply of claim 1, wherein the solar panel assembly attachment means comprises snap connection means permitting the detachable mounting of the solar panel assembly.

13. The portable power supply of claim 1, wherein the solar panel assembly comprises at least one photovoltaic panel attached to a backing panel.

14. The portable power supply of claim 13, wherein the backing panel is sectional and may be folded to protect the attached photovoltaic panel within the folded sections of the backing panel.

15. The portable power supply of claim 1, wherein the article holding area of sufficient in size to hold a portable computer.

16. The portable power supply of claim 1, additionally including means to detachably connect the opposing side panels of the case.

17. The portable power supply of claim 16, wherein the means to detachably connect the opposing side panels of the case is a zipper.

18. The portable power supply of claim 1, wherein the solar panel assembly attachment means are disposed on the exterior surfaces of the case panels.

19. The portable power supply of claim 1, wherein the case additionally includes a handle.

20. The portable power supply of claim 1, wherein the power transmission means includes an electrical storage device.

21. A portable power supply for detachable use with a variety of electronic devices of the type having an integral external housing encasing the electronic components of the device, the portable power supply comprising:

at least one solar panel assembly capable of producing an electrical power output through the conversion of solar energy to electrical energy, power transmission means for supplying the solar panel electrical output to an electronic device, the power transmission means including means to detachably connect the solar panel assembly to an electronic device thereby transmitting power, whereby, upon detachment of the connection means power transmission is ceased, the power transmission means permitting use of the solar panel assembly with a variety of electronic devices, a case comprising at least two opposing side panels, the spaced opposing side panels defining an intervening article holding area, the article holding area of the case being of sufficient size to accommodate an entire electronic device of the type having an integral external housing encasing the electronic components of the device, the article holding area further being of sufficient size to accommodate a variety of different electronic devices, and providing an area within which an electronic device may be detachably connected to the solar panel assembly by the power transmission means, the case further being completely readily separable from an electronic device held in the article holding area, the side panels including at least one solar panel attachment means for selectively detachably mounting of a solar panel assembly thereto.

* * * * *